United States Patent [19]

Koyama et al.

[11] 4,415,262

[45] Nov. 15, 1983

[54] PHOTOMASK

[75] Inventors: Naoki Koyama, Kokubunji; Youji Maruyama, Hamuramachi; Hiroshi Umezaki, Mitaka; Norikazu Tsumita, Kodaira; Yutaka Sugita, Tokorozawa, all of Japan

[73] Assignee: Hitachi, Ltd., Tokyo, Japan

[21] Appl. No.: 340,215

[22] Filed: Jan. 18, 1982

[30] Foreign Application Priority Data

Jan. 21, 1981 [JP] Japan ................................... 56-6404

[51] Int. Cl.³ ............................................ G03B 27/28
[52] U.S. Cl. ........................................ 355/125; 430/5
[58] Field of Search .......................... 355/80, 125, 71; 354/296; 430/5; 428/338

[56] References Cited

U.S. PATENT DOCUMENTS 3,403,024  9/1968  Luce ........................................ 430/5
3,476,658  11/1969  Corwin ................................. 430/54

Primary Examiner—Richard A. Wintercorn
Attorney, Agent, or Firm—Antonelli, Terry & Wands

[57] ABSTRACT

A photomask is disclosed which is suitable for use in the one-mask method capable of forming a plurality of patterns with one exposure, and in which an opaque pattern having a predetermined form and a semi-transparent pattern having another predetermined form are formed on a transparent substrate, and the semi-transparent pattern is formed of an opaque film having a large number of fine through holes.

24 Claims, 6 Drawing Figures

FIG. 1
PRIOR ART
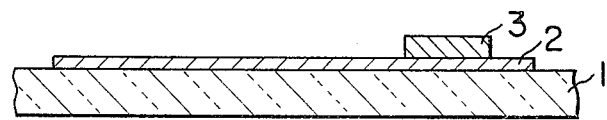
FIG. 2
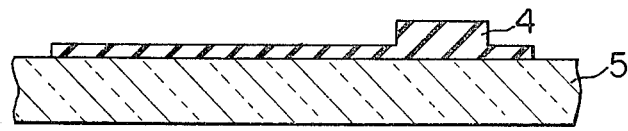
FIG. 3a
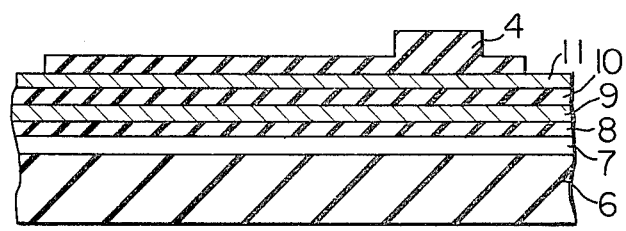
FIG. 3b
FIG. 4
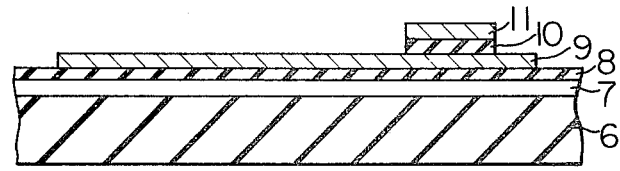
FIG. 5
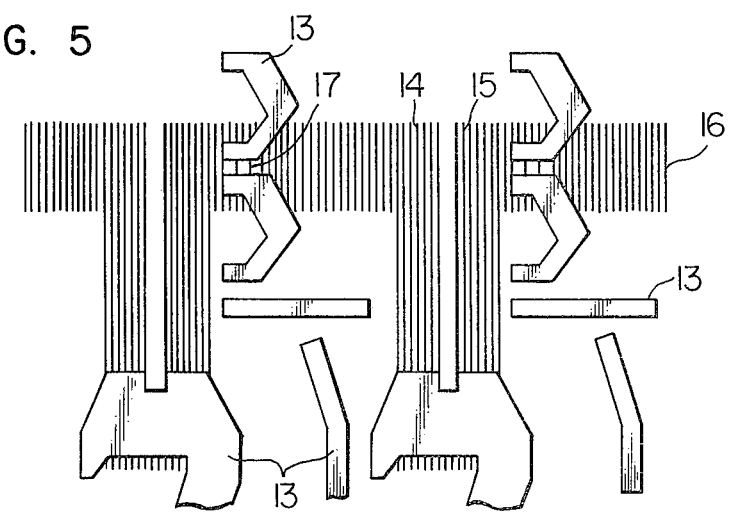

PHOTOMASK

BACKGROUND OF THE INVENTION

1. Field of the Invention

The present invention relates to a photomask, and more particularly to a photomask specifically suitable for use in a reduction projection exposing method for selectively exposing a photoresist film with a light beam with partially different intensity.

2. Description of the Prior Art

As is well known, various fine patterns in a magnetic bubble memory element and in semiconductor devices of various kinds are formed through the so-called photolithography.

The photolithography is useful for the formation of various fine patterns, but involves the following problems. For example, in the case where different patterns such as conductor and permalloy patterns in a magnetic bubble memory element are to be formed, it is required to use a plurality of photomasks, the number of which is equal to the number of kinds of patterns, and to carry out exposure and development for the same number of times. Accordingly, the pattern forming process is very cumbersome, and moreover it is very difficult to form each of fine patterns at its predetermined accurate position because a mask alignment error is inevitably accompanied at each mask alignment.

In order to solve such problems, a method has been proposed in which a photoresist film is irradiated with light in such a manner that the intensity of light incident upon a portion of the photoresist film is made different from the intensity of light incident upon another portion by using a mask having portions different in light transmissivity, in order to form a plurality of different patterns with a single photomask and one exposure (the above method is herein referred to as one-mask method).

In more detail, the photoresist film is exposed to light through a photomask such as shown in FIG. 1, which is provided with a mask pattern formed on a transparent quartz plate 1 and having a semi-transparent portion 2 and an opaque portion 3, and is then developed.

In the case where the photoresist film having been exposed to light is of positive type, the solubility of the exposed photoresist film is increased in accordance with the quantity of light having illuminated the photo-resist film. Accordingly, as shown in FIG. 2, a resist pattern 4 which has a cross section corresponding to that of the mask pattern shown in FIG. 1, is formed on a substrate 5 which is to be processed. When the photo-resist pattern formed in the above-mentioned manner and having portions different in thickness is used to form, for example, a magnetic bubble memory element, the following features are obtained which are not found in conventional methods.

That is, as shown in FIG. 3a, the resist pattern 4 having portions of different thickness is formed on a laminated structure. In the laminate, a monocrystalline magnetic garnet film 7 capable of holding magnetic bubbles, a first insulating film 8, a conductive film 9, a second insulating film 10 and a permalloy film 11 (namely, an alloy of iron and nickel) have been successively piled on a monocrystalline nonmagnetic garnet substrate 6.

Thereafter, dry etching is carried out for the above-mentioned laminated structure provided with the resist pattern 4. Then, as shown in FIG. 3b, the laminated structure has substantially the similar form as the resist pattern 4 in cross section, since the cross sectional form of the laminated structure obtained after the dry etching corresponds to that of the resist pattern 4. Thus, according to the one-mask method, a permalloy pattern 11 and a conductor pattern 9 are formed by exposing the photoresist film to light only once while using only one mask. Accordingly, there is no fear of an error arising due to mask alignment, and therefore a very accurate positional relation is obtained between the permalloy pattern 11 and the conductor pattern 9.

As mentioned above, the one-mask method has the advantages that the fabricating process is simple and that two or more kinds of patterns can be formed with a very accurate positional relation, but has a drawback that the fabrication of the photomask is cumbersome.

In order to form a mask pattern having portions of different light transmissivity, it has been required to form a plurality of patterns successively on a substrate through evaporation and photoetching techniques. Since the masking layer is formed through evaporation techniques, it is difficult to partially vary the thickness of a semi-transparent film, and further it is difficult to finely adjust the quantity of light passing through the semi-transparent film.

SUMMARY OF THE INVENTION

An object of the present invention is to provide a photomask for the one-mask method, which can solve the above-mentioned problems and is readily formed, and whose light transmissivity can be controlled to a desired value.

In order to attain the above object, according to the present invention, a finely apertured portion (e.g. a portion having fine through holes) is provided in an opaque film at a desired location thereof to form a semi-transparent portion, and thus a mask pattern having an opaque portion and a semi-transparent portion is obtained. The finely apertured portion may include a large number of separate dot-shaped apertures, line-shaped slits, etc. or may include a continuous mesh-shaped, or grid shaped aperture, or may include any other apertures which transmit part of light but do not form the image of individual apertures.

BRIEF DESCRIPTION OF THE DRAWINGS

FIG. 1 is a sectional view showing an example of the conventional photomasks for the one-mask method.

FIG. 2 is a sectional view for showing a photoresist pattern which is formed by using the photomask shown in FIG. 1.

FIGS. 3a and 3b are sectional views for explaining steps for forming a magnetic bubble memory element by the one-mask method.

FIG. 4 is a sectional view showing an embodiment of a photomask according to the present invention.

FIG. 5 is a plan view showing another embodiment of a photomask according to the present invention.

DESCRIPTION OF THE PREFERRED EMBODIMENTS

The present invention will be explained below in detail, with reference to the drawings.

FIG. 4 is a sectional view showing an embodiment of a photomask according to the present invention, and shows a photomask for forming a resist pattern 4 having a cross section as shown in FIG. 2. That is, the mask of FIG. 4 corresponds to the conventional photo-mask shown in FIG. 1. In the present embodiment, however, as is apparent from FIG. 4, a single film which has a uniform thickness and is made of the same material throughout the film, is deposited on a transparent substrate 1, and a finely perforated portion 2' exemplified to include a large number of fine apertures and another portion 3' provided with no fine aperture act as a semi-transparent film and an opaque film, respectively.

Light cannot pass through the portion 3' having no fine aperture and therefore the portion 3' acts as an opaque film. On the other hand, in the portion 2' having fine apertures 12, there are distributed those parts where light can pass through the film, and those parts where light cannot pass through the film. However, since the dimension of the fine apertures 12 is set smaller than the resolution limit of the reduction exposure system, it does not give a sufficient change of light intensity (contrast) for forming the image of respective apertures 12, but gives a uniformly spread light intensity corresponding to the area of the apertures. As a result, the portion 2' having a large number of fine apertures 12 acts as a semi-transparent film.

As mentioned previously, in the conventional photo-mask for the one-mask method, it is required to form the thick portion 3 and the thin portion 2 separately, and therefore the formation of mask pattern has been very cumbersome.

On the other hand, according to the present embodiment, an opaque portion and a semi-transparent portion can be simultaneously formed by making fine apertures at a desired portion in a single opaque film having a uniform thickness. Accordingly, the photomask having the opaque portion and semi-transparent portion is far readily formed as compared with the conventional photomask.

Moreover, the quantity of light passing through the semi-transparent portion can be varied by changing the total area of the apertures 12 (which is dependent upon the diameter of each aperture and the number of apertures per unit area), and therefore it is very easy to adjust the quantity of light incident upon a photo-resist film at a predetermined value. This is a marked feature of the present invention which cannot be obtained by the conventional photomask.

FIG. 5 is a plan view of another embodiment of a photomask, for showing a mask pattern in a photo-mask which is used to form a conductor pattern and a permalloy pattern in a magnetic bubble memory element.

The mask pattern shown in FIG. 5 is formed of a chromium film having a thickness of about 70 nm, and includes an opaque pattern 13 and a semi-transparent pattern 16. The opaque pattern 13 and semi-transparent pattern 16 correspond to the permalloy pattern and the conductor pattern, respectively, and both of the opaque and semi-transparent patterns 13 and 16 are formed on a transparent substrate.

As is apparent from FIG. 5, the opaque pattern 13 having a shape corresponding to the permalloy pattern is formed of the continuous chromium film. On the other hand, in the semi-transparent pattern 16 having a shape corresponding to the conductor pattern, a large number of parallel linear chromium film strips 14 are disposed uniformly in such a manner that a linear aperture 15 is provided between each pair of adjacent chromium film strips 14. In this case also, the dimension of the line-shaped slits is set no greater than the resolution limit of the exposure system, therefore the pattern 16 acts as a semi-transparent pattern.

In the present embodiment, the quantity of light passing through the semi-transparent pattern 16 can be adjusted by changing a ratio of the total area of the linear apertures 15 to the area of the pattern 16, as in the embodiment shown in FIG. 4.

In a photomask according to the present invention, an opaque pattern and a semi-transparent pattern can be simultaneously formed by a single photoetching process since these patterns can be formed of the same film. This provides a large practical advantage.

In an example of the embodiment shown in FIG. 5, the opaque pattern 13 corresponding to the permalloy pattern is formed of a continuous chromium film (having a thickness of about 70 nm), and the semi-transparent pattern 16 corresponding to the conductor pattern includes linear chromium film strips 14 each having a width of 1 $\mu$m and a thickness of about 70 nm and disposed to leave linear apertures 15 each having a width of 1 $\mu$m.

Further, in a portion 17 corresponding to narrow region of the conductor pattern standing between adjacent permalloy patterns, the width of each linear aperture 15 and the width of each linear chromium film 14 are selected to 2 $\mu$m and 1 $\mu$m, respectively, to increase the quantity of light passing through the portion 17.

When different patterns, for example the conductor pattern and the permalloy pattern, are formed by the conventional one-mask method, a portion of a photoresist film corresponding to a region of the conductor pattern standing between adjacent permalloy patterns may become thick and therefore the resolving power for the two patterns is reduced.

According to the present invention, the area of each aperture is made larger in the portion 17 to increase the quantity of light passing through the portion 17. Accordingly, the solubility of the photoresist film is also high at such a portion corresponding to the portion 17, and therefore the thickness of the photoresist film becomes small at this portion after the photoresist film has been developed. Thus, the reduction in the resolving power for the pattern can be prevented. This is another one of the marked features of the present invention which cannot be obtained by the conventional one-mask method.

As is evident from the foregoing explanation, a main feature of the present embodiment over the conventional photomask resides in that a large number of fine apertures are provided in a film made of an opaque material, and the opaque film having the fine apertures acts as a semi-transparent film on the basis of the diffraction of light. It is needless to say that opaque and semi-transparent patterns may be formed of different films which are different in material and/or in thickness from each other. However, it is most preferable from the practical point of view to form these patterns of a film which is uniform in material and thickness throughout the film, since the patterns can be simultaneously formed on the transparent substrate in one fabricating process.

The fine apertures are provided to cause light to pass through the "semi-transparent" pattern and to diffract light, and therefore may have various forms such as a circular form, a spiral form and a square form. Also, fine apertures may be connected to appear as mesh, grid, etc. For example, the fine apertures may have such a linear form as shown in FIG. 5. Such apertures will be totally referred to as apertures, or through holes and the portion having such apertures will be referred to as apertured portion.

The size (namely, the dimension) of the apertures and the distance between adjacent apertures (namely, the distance between respective centers of adjacent apertures) are important in the present invention.

When the photomask according to the preceding embodiments is used in the reduction projection exposure, an image of each aperture will be formed on the photoresist film if the size of the apertures is too large. Therefore, it is required to make the size of the apertures smaller than a predetermined value. For the same reason, it is also required to make the distance between adjacent apertures smaller than a predetermined value.

In the projection exposure system, the dimension of a pattern at the resolution limit, below which a discernible image cannot be formed, can be given, on the image plane, by ($\lambda$/2NA), where $\lambda$ indicates the exposing wavelength and NA represents the numerical aperture of the projection lens. Considering the reduction ratio M of the reduction exposure lens, the corresponding resolution limit on the mask can be given by $$\frac{\lambda}{2NA} \times \frac{1}{M}.$$

Therefore, the maximum value for the dimension of apertures and for the distance between adjacent apertures should be no greater than this resolution limit on the mask for providing desirable results. For example, when the exposing wavelength $\lambda$ is 436 nm (=0.436 $\mu$m), the numerical aperture of the lens (NA) is 0.28 and the reduction ratio is 1/10, the maximum value for each of the dimension of apertures and the distance between adjacent apertures is calculated as 7.8 $\mu$m.

When the size of the apertures and the distance between adjacent apertures are greater than the above-mentioned values, a portion of the photoresist film may be completely dissolved or the unevenness in the thickness of the photoresist film may be generated in an irregular fashion, and therefore a favorable result cannot be obtained.

When a conductor pattern and a permalloy pattern in a magnetic bubble memory element was formed by the one-mask method using the photomask shown in FIG. 5, a permalloy pattern having a minimum width of 1 $\mu$m and a minimum distance of 1 $\mu$m could be formed with high accuracy, simultaneously with the conductor pattern. This result will present an example of the utility of the present invention.

As is evident from the foregoing explanation, according to the present invention, an opaque portion and a semi-transparent portion can be readily formed in a photomask for the one-mask method, by providing a finely apertured portion in the photomask. Further, it is easy to make the light transmissivity of the semi-transparent portion equal to a desired value. Furthermore, the photoresist pattern can be made to have a favorable sectional structure even at a narrow semi-transparent region standing between opaque regions, and thus the reduction in the resolving power can be prevented. In other words, the present invention has the above-mentioned features which cannot be obtained by the conventional photomask, and therefore can exhibit a remarkable effect.

In the above-mentioned embodiment, both of the opaque pattern and semi-transparent pattern are formed of the chromium film. However, various films made of other materials than chromium may be used. For example, not only a metal film such as a molybdenum (Mo) film, a titanium (Ti) film, a gold (Au) film, or an aluminum (Al) film but also an opaque dielectric film such as a chromium oxide ($Cr_2O_3$) film can produce a favorable result.

We claim:

1. A photomask comprising:
   a plurality of mask portions of different light transmissivity for forming a plurality of photoresist pattern portions different in thickness through one exposure, said mask portions including at least one opaque pattern formed on a transparent substrate and having a predetermined form and at least one semi-transparent pattern,
   said at least one semi-transparent pattern being formed on said transparent substrate and having a predetermined form, said at least one semi-transparent pattern being formed of a finely apertured opaque film.

2. A photomask according to claim 1, wherein said at least one opaque pattern and said at least one semi-transparent pattern are equal in thickness to each other.

3. A photomask according to claim 1, wherein said at least one opaque pattern and said at least one semi-transparent pattern are different in thickness from each other.

4. A photomask according to claim 2 or 3, to be used in a reduction exposure system having an exposing light source for emitting lights around a wavelength $\lambda$ and a lens system of a reduction ratio M and of a numerical aperture NA, wherein said finely apertured opaque film includes an aperture of a dimension not greater than about $$\frac{\lambda}{2NA} \times \frac{1}{M}.$$

5. A photomask according to claim 4, wherein said finely apertured opaque film includes mutually adjacent apertures, the distance between which is not greater than about $$\frac{\lambda}{2NA} \times \frac{1}{M}.$$

6. A photomask according to claim 2, wherein a film for forming said at least one opaque pattern and said film for forming said at least one semi-transparent pattern are made of the same material.

7. A photomask according to claim 6, wherein said material is one selected from a group consisting of chromium, molybdenum, titanium, gold, aluminum and chromium oxide.

8. A photomask according to claim 3, wherein said at least one opaque pattern and said at least one semi-transparent pattern are made of the same material.

9. A photomask according to claim 4, wherein a material for making said at least one opaque pattern is different from a material for making said at least one semi-transparent pattern.

10. A photomask according to claim 8, wherein said material is one selected from a group consisting of chromium, molybdenum, titanium, gold, aluminum and chromium oxide.

11. A photomask according to claim 9, wherein said materials are selected from a group consisting of chromium, molybdenum, titanium, gold, aluminum and chromium oxide.

12. A photomask to be used in a reduction exposure system having an exposing light source for emitting lights around a wavelength λ and a lens system of a reduction ratio M and of a numerical aperture NA, comprising:
at least one opaque pattern formed on a transparent substrate and having a predetermined form; and
at least one semi-transparent pattern formed on said transparent substrate and having a predetermined form, the semi-transparent patterns being formed of a finely apertured opaque film,
wherein said finely apertured opaque film includes an aperture of a dimension not greater than about $$\frac{\lambda}{2NA} \times \frac{1}{M}.$$

13. A photomask to be used in a reduction exposure system having an exposing light source for emitting lights around a wavelength λ and a lens system of a reduction ratio M and of a numerical aperture NA, comprising:
at least one opaque pattern formed on a transparent substrate and having a predetermined form; and
at least one semi-transparent pattern formed on said transparent substrate and having a predetermined form, the semi-transparent patterns being formed of a finely apertured opaque film, said at least one opaque pattern and said at least one semi-transparent pattern being equal in thickness to each other;
wherein said finely apertured opaque film includes an aperture of a dimension not greater than about $$\frac{\lambda}{2NA} \times \frac{1}{M}.$$

14. A photomask to be used in a reduction exposure system having an exposing light source for emitting lights around a wavelength λ and a lens system of a reduction ratio M and of a numerical aperture NA, comprising:
at least one opaque pattern formed on a transparent substrate and having a predetermined form; and
at least one semi-transparent pattern formed on said transparent substrate and having a predetermined form, the semi-transparent patterns being formed of a finely apertured opaque film, the at least one opaque pattern and the at least one semi-transparent pattern being different in thickness from each other;
wherein said finely apertured opaque film includes an aperture of a dimension not greater than about $$\frac{\lambda}{2NA} \times \frac{1}{M}.$$

15. A photomask according to any one of claims 12-14, wherein said finely apertured opaque film includes mutually adjacent apertures, the distance between which is not greater than about $$\frac{\lambda}{2NA} \times \frac{1}{M}.$$

16. A photomask according to any one of claims 12-14, wherein a material for making said at least one opaque pattern is different from a material for making said at least one semi-transparent pattern.

17. A photomask according to claim 16, wherein said materials are selected from a group consisting of chromium, molybdenum, titanium, gold, aluminum and chromium oxide.

18. A photomask comprising:
at least one opaque pattern formed on a transparent substrate and having a predetermined form; and
at least one semi-transparent pattern formed on said transparent substrate and having a predetermined form, the semi-transparent patterns being formed of a finely apertured opaque film,
wherein said at least one opaque pattern and said at least one semi-transparent pattern are equal in thickness to each other and are made of films of the same material, said same material being selected from the group consisting of chromium, molybdenum, titanium, gold, aluminum and chromium oxide.

19. A photomask comprising:
at least one opaque pattern formed on a transparent substrate and having a predetermined form; and
at least one semi-transparent pattern formed on said transparent substrate and having a predetermined form, the semi-transparent patterns being formed of a finely apertured opaque film,
wherein said at least one opaque pattern and said at least one semi-transparent pattern are different in thickness from each other and are made of films of the same material, said same material being selected from the group consisting of chromium, molybdenum, titanium, gold, aluminum and chromium oxide.

20. A photomask comprising:
at least one opaque pattern formed on a transparent substrate and each having a predetermined form; and
at least one semi-transparent pattern formed on said transparent substrate and having a predetermined form, the semi-transparent patterns being formed of a finely apertured opaque film and capable of transmitting part of incident light but not of forming the image of individual apertures.

21. A photomask according to any one of claims 12, 13, 14, 18, 19 or 20, wherein said at least one semi-transparent pattern includes at least one first semi-transparent pattern and at least one second semi-transparent pattern, the first and second semi-transparent patterns having different ratios of total areas of apertures to total areas of pattern, whereby the first and second semi-transparent patterns have different amounts of light transmitted therethrough.

22. A photomask according to claim 12 or 20, wherein said at least one opaque pattern includes two opaque patterns adjacent to, but spaced from, each other, and wherein said at least one semi-transparent pattern includes two semi-transparent patterns, with one of said semi-transparent patterns positioned in the space between said two opaque patterns and with the areas of the apertures of said one of the semi-transparent patterns being larger than the areas of the other of the semi-transparent patterns, whereby the quantity of light passing through said one of the semi-transparent patterns is increased relative to the other of the semi-transparent patterns.

23. A photomask according to claim 20, wherein the apertures of said finely apertured opaque film are sized to diffract the incident light.

24. A photomask according to claim 20 or 23, wherein the distance between adjacent apertures of said finely apertured opaque film is such that the semi-transparent pattern is not capable of forming an image of the opaque film portions between adjacent apertures.

* * * * *